(12) United States Patent
Hwang et al.

(10) Patent No.: US 11,917,856 B2
(45) Date of Patent: Feb. 27, 2024

(54) ORGANIC LIGHT EMITTING DISPLAY DEVICE

(71) Applicant: LG Display Co., Ltd., Seoul (KR)

(72) Inventors: Seonghan Hwang, Goyang-si (KR); Wonrae Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 392 days.

(21) Appl. No.: 17/405,948

(22) Filed: Aug. 18, 2021

(65) Prior Publication Data
US 2022/0069259 A1    Mar. 3, 2022

(30) Foreign Application Priority Data
Aug. 28, 2020   (KR) .......................... 10-2020-0109693

(51) Int. Cl.
*H10K 50/86*   (2023.01)
*H10K 59/122*  (2023.01)
*H10K 71/00*   (2023.01)
*H10K 59/124*  (2023.01)
*H10K 59/12*   (2023.01)

(52) U.S. Cl.
CPC ......... *H10K 50/865* (2023.02); *H10K 59/122* (2023.02); *H10K 71/00* (2023.02); *H10K 59/1201* (2023.02); *H10K 59/124* (2023.02)

(58) Field of Classification Search
CPC .. H10K 50/865; H10K 59/122; H10K 59/124; H10K 59/38; H10K 59/351; H10K 59/88
See application file for complete search history.

(56) References Cited

U.S. PATENT DOCUMENTS
2018/0095195 A1* 4/2018 Kim ....................... G02B 5/003

FOREIGN PATENT DOCUMENTS
KR   10-2019-0024684 A   3/2019
KR   10-2020-0027136 A   3/2020

* cited by examiner

*Primary Examiner* — Syed I Gheyas
(74) *Attorney, Agent, or Firm* — Fenwick & West LLP

(57) ABSTRACT

An organic light-emitting display device includes first to third color filters disposed respectively in first to third sub-pixel areas, a planarization layer disposed on the first to third color filters, and a bank layer disposed on the planarization layer and between adjacent sub-pixel areas, wherein a portion of the second color filter protrudes upwardly beyond a top face of the planarization layer, wherein the bank layer covers the portion of the second color filter protruding upwardly beyond the top face of the planarization layer. The display device has a stack structure of the portion of the blue color filter protruding upwardly beyond a top face of the planarization layer and the bank layer covering the portion, thereby suppressing light leakage between adjacent sub-pixel areas, and improving a lifetime of an organic light emitting element.

19 Claims, 5 Drawing Sheets

ORGANIC LIGHT EMITTING DISPLAY DEVICE

CROSS-REFERENCE TO RELATED APPLICATION

This application claims a benefit under 35 U.S.C. § 119(a) of Korean Patent Application No. 10-2020-0109693 filed on Aug. 28, 2020, on the Korean Intellectual Property Office, the entirety of disclosure of which is incorporated herein by reference for all purposes.

BACKGROUND

Field

The present disclosure relates to an organic light-emitting display device, and more specifically, to an organic light-emitting display device having suppressed light leakage defect and an increased lifetime of an organic light-emitting element.

Description of Related Art

As the information society develops, the demand for display devices is increasing in various forms. In response to this demand, various display panels such as liquid crystal display panels, plasma display panels, and organic light-emitting display panels are being researched and commercialized.

An organic light-emitting display device to which the organic light-emitting display panel is applied is a self-luminous display device. Unlike a liquid crystal display device, the organic light-emitting display device does not require a separate light source and thus is relatively light and thin. Further, the organic light-emitting display device operates at a low voltage, and has excellent characteristics in color rendering, response speed, viewing angle, contrast ratio, etc., and has been widely used in recent years.

Conventionally, a black matrix is provided to prevent light leakage defect in the organic light-emitting display devices. However, recently, research on organic light-emitting display devices that employ black banks that are more advantageous in widening the viewing angle, preventing the light leakage defect, and realizing high luminance are being actively carried out.

SUMMARY

The organic light-emitting display device with the black bank has superior light leakage prevention ability to the organic light-emitting display device with the black matrix. Since a material of the black bank has black color, the black bank may act as a polarizer attached to a surface of the organic light-emitting display device. Accordingly, the organic light-emitting display device employing the black bank does not have decrease in the transmittance that would otherwise be caused by the polarizer, and thus, realizes high luminance. However, due to the nature of the material, the black bank has a higher out-gassing possibility than the transparent bank has. Accordingly, when the black bank is applied to an organic light-emitting display device, there has been a problem that efficiency and a lifespan of the organic light-emitting element are deteriorated due to the out-gassing.

The present disclosure is to solve the above-described problem, and thus has a purpose to provide an organic light-emitting display device which may improve the light leakage defect between neighboring sub-pixel areas, thereby achieving excellent color gamut and color reproduction range.

Further, another purpose of the present disclosure is to provide an organic light-emitting display device capable of reducing the out-gassing from the bank, thereby increasing a lifetime of an organic light-emitting element.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

According to an embodiment of the present disclosure, an organic light-emitting display device in which the light leakage defect is suppressed, and a lifetime of an organic light-emitting element increases may be provided.

The organic light-emitting display device according to one embodiment of the present disclosure includes first to third color filters disposed respectively in first to third sub-pixel areas, a planarization layer disposed on the first to third color filters, and a bank layer disposed on the planarization layer and between adjacent sub-pixel areas, wherein a portion of the second color filter protrudes upwardly beyond a top face of the planarization layer, wherein the bank layer covers the portion of the second color filter protruding upwardly beyond the top face of the planarization layer.

An organic light-emitting display device according to one embodiment of the present disclosure includes first to third color filters respectively disposed in a first sub-pixel area, a third sub-pixel area and a fourth sub-pixel area among first to fourth sub-pixel areas, a planarization layer disposed on the first to third color filters, and a bank layer disposed on the planarization layer and between adjacent sub-pixel areas, wherein a portion of the second color filter protrudes upwardly beyond a top face of the planarization layer, and the bank layer covers the portion of the second color filter protruding upwardly beyond a top face of the planarization layer.

An organic light-emitting display device according to one embodiment of the present disclosure includes a plurality of color filters respectively disposed in a plurality of sub-pixel areas, a planarization layer covering the plurality of color filters, and a bank layer disposed on the planarization layer and between two adjacent sub-pixel areas, wherein a portion of the first color filter among the plurality of color filters protrudes upwardly beyond a top face of the planarization layer and is inserted into the bank layer.

According to the present disclosure, the display device may have a stack structure of a portion of the blue color filter protruding upwardly beyond a top face of the planarization layer and the bank covering the portion and thus absorbing light incident on the bank through various paths, thereby suppressing the light leakage between adjacent sub-pixel areas. Accordingly, the color gamut and color reproduction range of the image displayed by the organic light-emitting display device may be improved.

Further, according to the present disclosure, an amount of the pigment in the bank may be reduced to prevent the lifespan of the organic light-emitting element from deteriorating due to the out-gassing of the bank layer.

Effects of the present disclosure are not limited to the above-mentioned effects, and other effects as not mentioned will be clearly understood by those skilled in the art from following descriptions.

DETAILED DESCRIPTIONS

Figure 1:
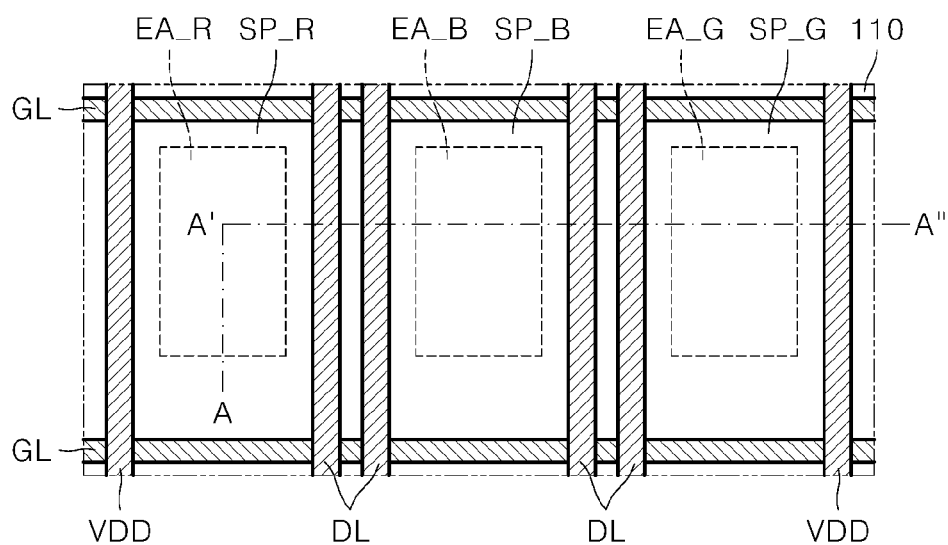
FIG. 1 is an enlarged view of one pixel area of an organic light-emitting display device according to one embodiment of the present disclosure, and schematically shows a plane of a pixel area of a three-color (R, G, B) organic light-emitting display device.

Advantages and features of the present disclosure, and a method of achieving the Advantages and features will become apparent with reference to embodiments described later in detail together with the accompanying drawings. However, the present disclosure is not limited to the embodiments as disclosed below, but may be implemented in various different forms. Thus, these embodiments are set forth only to make the present disclosure complete, and to completely inform the scope of the disclosure to those of ordinary skill in the technical field to which the present disclosure belongs, and the present disclosure is only defined by the scope of the claims.

A shape, a size, a ratio, an angle, a number, etc. disclosed in the drawings for describing the embodiments of the present disclosure are exemplary, and the present disclosure is not limited thereto. The same reference numerals refer to the same elements herein. Further, descriptions and details of well-known steps and elements are omitted for simplicity of the description. Furthermore, in the following detailed description of the present disclosure, numerous specific details are set forth in order to provide a thorough understanding of the present disclosure. However, it will be understood that the present disclosure may be practiced without these specific details. In other instances, well-known methods, procedures, components, and circuits have not been described in detail so as not to unnecessarily obscure aspects of the present disclosure.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof. As used herein, the term "and/or" includes any and all combinations of one or more of the associated listed items. Expression such as "at least one or when preceding a list of" elements may modify the entire list of elements and may not modify the individual elements of the list. In interpretation of numerical values, an error or tolerance therein may occur even when there is no explicit description thereof.

In addition, it will also be understood that when a first element or layer is referred to as being present "on" a second element or layer, the first element may be disposed directly on the second element or may be disposed indirectly on the second element with a third element or layer being disposed between the first and second elements or layers. It will be understood that when an element or layer is referred to as being "connected to", or "coupled to" another element or layer, it may be directly on, connected to, or coupled to the other element or layer, or one or more intervening elements or layers may be present. In addition, it will also be understood that when an element or layer is referred to as being "between" two elements or layers, it may be the only element or layer between the two elements or layers, or one or more intervening elements or layers may also be present.

Further, as used herein, when a layer, film, region, plate, or the like is disposed "on" or "on a top" of another layer, film, region, plate, or the like, the former may directly contact the latter or still another layer, film, region, plate, or the like may be disposed between the former and the latter. As used herein, when a layer, film, region, plate, or the like is directly disposed "on" or "on a top" of another layer, film, region, plate, or the like, the former directly contacts the latter and still another layer, film, region, plate, or the like is not disposed between the former and the latter. Further, as used herein, when a layer, film, region, plate, or the like is disposed "below" or "under" another layer, film, region, plate, or the like, the former may directly contact the latter or still another layer, film, region, plate, or the like may be disposed between the former and the latter. As used herein, when a layer, film, region, plate, or the like is directly disposed "below" or "under" another layer, film, region, plate, or the like, the former directly contacts the latter and still another layer, film, region, plate, or the like is not disposed between the former and the latter.

In descriptions of temporal relationships, for example, temporal precedent relationships between two events such as "after", "subsequent to", "before", etc., another event may occur therebetween unless "directly after", "directly subsequent" or "directly before" is indicated.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The features of the various embodiments of the present disclosure may be partially or entirely combined with each other, and may be technically associated with each other or operate with each other. The embodiments may be implemented independently of each other and may be implemented together in an association relationship.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, an organic light-emitting display device according to various embodiments of the present disclosure will be described in detail.

In general, organic light-emitting display devices may be classified into a top emission type device and a bottom emission type device according to an emission direction of light.

Hereinafter, for convenience of description, it is assumed that the organic light-emitting display device according to one embodiment of the present disclosure is a bottom emission type device. However, key features of the present disclosure to be described below may be equally applied to the top emission type device.

FIG. 1 is an enlarged view of one pixel area of an organic light-emitting display device according to one embodiment of the present disclosure, and schematically shows a plane of the pixel area of a three-color (R, G, B) organic light-emitting display device.

Referring to FIG. 1, signal lines including a gate line GL, a data line DL and a driving voltage line VDD are disposed on substrate 110. The gate line GL, the data line DL, and the driving voltage line VDD cross each other.

According to the present embodiment, on the substrate 110, a red sub-pixel area SP_R, a blue sub-pixel area SP_B, and a green sub-pixel area SP_G may be defined by the aforementioned signal lines.

For example, each of the red sub-pixel area SP_R and the green sub-pixel area SP_G may be defined by two gate lines GL extending in parallel with each other and the driving voltage line VDD and the data line DL crossing the gate lines GL. Further, each of the blue sub-pixel area SP_B may be defined by two gate lines GL extending in parallel with each other and two data lines DL intersecting the same. An arrangement order of the pixel areas, and a type and the number of signal lines extending between the adjacent pixel areas may vary as necessary.

The red sub-pixel area SP_R, the blue sub-pixel area SP_B, and the green sub-pixel area SP_G defined on the substrate 110 contain a red light-emitting area EA_R, a blue light-emitting area EA_B, and a green light-emitting area EA_G, respectively.

Figure 2:
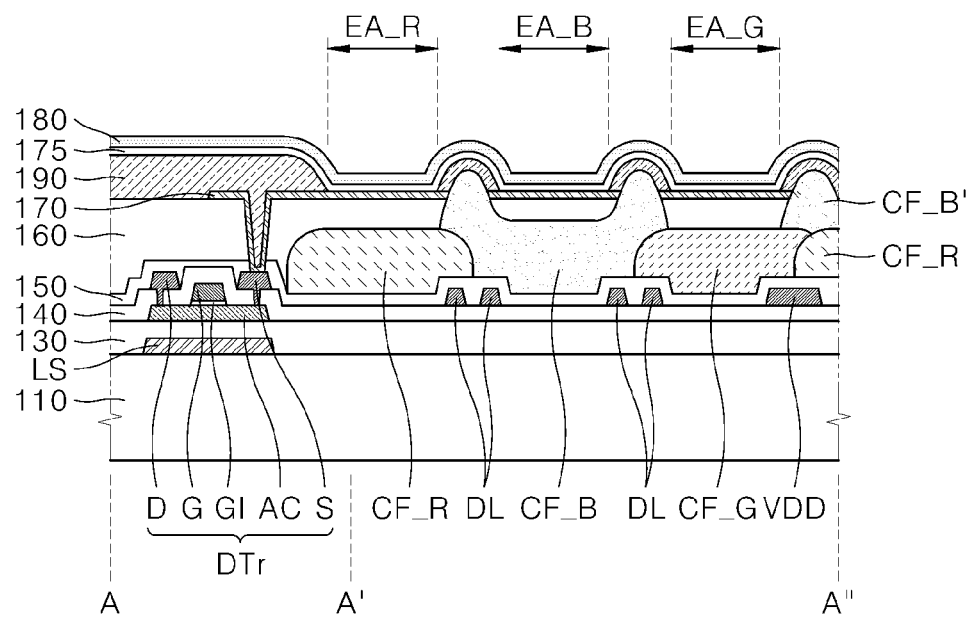
FIG. 2 shows a cross section of the organic light-emitting display device cut along a A-A'-A" cutting line in FIG. 1.

In this connection, the red light-emitting area EA_R, the blue light-emitting area EA_B, and the green light-emitting area EA_G may be defined as areas not to be covered with the bank (190 in FIG. 2). That is, a remaining area except for the red light-emitting area EA_R, the blue light-emitting area EA_B, and the green light-emitting area EA_G may be covered with the bank 190.

FIG. 2 shows a cross section of the organic light-emitting display device cut along a A-A'-A" cutting line in FIG. 1.

In particular, the cross section cut along the A-A' cutting line represents a cross section of a circuit area equipped with a driving thin-film transistor DTr of the organic light-emitting display device according to one embodiment of the present disclosure. Further, the cross section cut according to the A'-A" cutting line represents a cross section of a light-emitting area of the organic light-emitting display device according to one embodiment of the present disclosure.

First, referring to the section cut along the A-A' cutting line, a light-blocking layer LS, a buffer layer 130, a driving thin-film transistor DTr, an interlayer insulating film 140, a passivation layer 150, a planarization layer 160, a bank (or bank layer) 190, color filters CF_R, CF_B, and CF_G, a dummy blue color filter CF_B', a first electrode 170, an organic light-emitting layer 175, and a second electrode 180 may be disposed on the substrate 110.

The light-blocking layer LS may be disposed on the substrate 110 to overlap the driving thin-film transistor DTr. The light-blocking layer LS may be made of a metal such as molybdenum (Mo), aluminum (Al), chromium (Cr), and silver (Ag), or an alloy thereof. However, the present disclosure is not limited thereto. The light-blocking layer LS may be made of various materials known in the art. The light-blocking layer LS may prevent external light from invading the driving thin-film transistor DTr.

The buffer layer 130 may be disposed on the light-blocking layer LS and cover the light-blocking layer LS. According to an example, the buffer layer 130 may be formed by stacking a plurality of inorganic layers. For example, the buffer layer 130 may be formed of a multilayer in which at least two inorganic layers among a silicon oxide layer $SiO_x$, a silicon nitride layer $SiN_x$, and a silicon oxynitride layer SiON are stacked vertically. This buffer layer 130 may be formed on an entire top face of the substrate 110 to prevent moisture from penetrating into the organic light-emitting element through the substrate 110.

The driving thin-film transistor DTr may be disposed on a top face of the buffer layer 130. According to an example, the driving thin-film transistor DTr may include an active layer AC, a gate electrode G, a drain electrode D, and a source electrode S. The active layer AC may be disposed on the buffer layer 130 so as to overlap with the light-blocking layer LS. The active layer AC may be in direct contact with source electrode S and the drain electrode D. The active layer AC may face away from the gate electrode G while the gate insulating film GI may be interposed therebetween. The gate insulating film GI may only be disposed between the gate electrode G and the active layer AC. Alternatively, the gate insulating film GI may be disposed on the active layer AC and the buffer layer 130. The gate electrode G may be disposed on the gate insulating film GI. The gate electrode G may overlap with the active layer AC while the gate insulating film GI is interposed therebetween.

The interlayer insulating film 140 may be disposed on the gate electrode G, the active layer AC, and the buffer layer 130. The interlayer insulating film 140 may protect the driving thin-film transistor DTr and may insulate the drain electrode D and the source electrode S from the gate electrode G. The interlayer insulating film 140 may be partially removed to allow contact between the active layer AC and the source electrode S or the drain electrode D. For example, the interlayer insulating film 140 may include contact holes through which the source electrode S and the drain electrode D pass.

The drain electrode D and the source electrode S may be spaced apart from each other and disposed on the interlayer insulating film 140. The drain electrode D may contact one side of the active layer AC via one contact hole provided in the interlayer insulating film 140, while the source electrode S may contact the opposite side of the active layer AC via the opposite contact hole provided in the interlayer insulating film 140.

FIG. 2 shows that the driving thin-film transistor DTr has a top gate structure. However, the present disclosure is not limited thereto. The driving thin-film transistor DTr may have a bottom gate structure, or a double gate structure.

The passivation layer 150 may be disposed on the interlayer insulating film 140 and the driving thin-film transistor DTr. The passivation layer 150 may protect the driving thin-film transistor DTr. The passivation layer 150 may be made of an inorganic insulating material such as silicon oxide and silicon nitride, or an organic insulating material such as photoacrylic or benzocyclobutene.

The planarization layer 160 may be disposed on the passivation layer 150 to remove an unevenness caused by the driving thin-film transistor DTr. The planarization layer 160 may be made of an organic insulating material such as photoacrylic or benzocyclobutene.

On the planarization layer 160, the first electrode 170 electrically connected to the source electrode S of the driving thin-film transistor DTr through the planarization layer 160 and the passivation layer 150 is disposed.

As described above, the bank 190 is disposed along an edge of the first electrode 170 to define a light-emitting area of each pixel area. The organic light-emitting layer 175 and the second electrode 180 are sequentially and vertically disposed on the bank 190 and the first electrode 170. In this connection, the first electrode 170, the organic light-emitting layer 175 and the second electrode 180 constitute the organic light-emitting element. The organic light-emitting layer 175 may emit white light.

Next, referring to the section cut along the A'-A" cutting line, the buffer layer 130 and the interlayer insulating film 140 are disposed on the substrate 110. Signal lines defining each sub-pixel area are located on the interlayer insulating film 140. For example, the data lines DL may be located between the red light-emitting area EA_R and the blue light-emitting area EA_B and between the blue light-emitting area EA_B and the green light-emitting area EA_G. The driving voltage line VDD may be located between the green light-emitting area EA_G and the adjacent red light-emitting area EA_R.

The red color filter CF_R is located in the red light-emitting area EA_R, the blue color filter CF_B is located in the blue light-emitting area EA_B, and a green color filter CF_G is located in the green light-emitting area EA_G. The color filters CF_R, CF_B, and CF_G are disposed on the passivation layer 150 covering the data line DL and the driving voltage line VDD.

On the passivation layer 150, the planarization layer 160 covering at least a portion of each of the color filters CF_R, CF_B, and CF_G is disposed.

A portion of the blue color filter CF_B between two adjacent sub-pixel areas (or two adjacent light-emitting areas) may protrude upwardly beyond a top face of the planarization layer 160. For example, a portion of the blue color filter CF_B between the red sub-pixel area SP_R and the blue sub-pixel area SP_B may protrude upwardly beyond a top face of the planarization layer 160 while covering an end of the red color filter CF_R. A portion of the blue color filter CF_B between the blue sub-pixel area SP_B and the green sub-pixel area SP_G may protrude upwardly beyond a top face of the planarization layer 160 while covering an end of the green color filter CF_G. The portion of the blue color filter CF_B protruding upwardly beyond a top face of the planarization layer 160 may be covered with the bank 190.

Sub-pixel areas may be periodically and repeatedly arranged to form a matrix. Thus, the dummy blue color filter CF_B' may be additionally disposed between the green sub-pixel area SP_G and the red sub-pixel area SP_R. The additionally disposed dummy blue color filter CF_B' may protrude upwardly beyond a top face of the planarization layer 160 while simultaneously covering an end of the green color filter CF_G and an end of the red color filter CF_R. The dummy blue color filter CF_B' disposed between the green sub-pixel area SP_G and the red sub-pixel area SP_R and protruding upwardly beyond a top face of the planarization layer 160 may be entirely covered with the bank 190. According to the present disclosure, the 'dummy blue color filter' may refer to a blue color filter made of the same material as the blue color filter CF_B disposed in the blue sub-pixel area SP_B, but disposed outside the blue sub-pixel area SP_B.

In other words, the portions of the blue color filter CF_B and the dummy blue color filter CF_B' protruding upwardly beyond a top face of the planarization layer 160 may be respectively disposed between the red sub-pixel area SP_R and the blue sub-pixel area SP_B, between the blue sub-pixel area SP_B and the green sub-pixel area SP_G, and between the green sub-pixel area SP_G and the red sub-pixel area SP_R and may be inserted into the bank 190.

The bank 190 refers to a layer made of a material that may absorb light, and may prevent the light emitted through the organic light-emitting layer 175 in one sub-pixel area from invading neighboring sub-pixel areas through various paths.

In one embodiment, the bank 190 may be made of a resin containing a black pigment. The bank 190 may be made of a composition containing a black pigment, a binder resin, a solvent and a dispersant. For example, carbon black may be used as the black pigment. The black pigment may be contained in 15% to 25% by weight relative to the weight of the binder resin constituting the bank 190. A transmittance of the bank 190 may range from 40% to 60% in a 380 nm to 650 nm wavelength range (an optical density thereof is about 0.65). This content of the black pigment is reduced to about ½ of a content of a black pigment constituting a conventional black bank (the transmittance thereof is lower than or equal to 5% in the wavelength range of 380 nm to 650 nm and the optical density thereof is 1.3).

A type of the binder resin may vary depending on a curing scheme. In a UV curing scheme, the binder resin may be an acrylate-based resin, a cardo-based resin, or a polyimide-based resin. The acrylate-based resin may include, for example, ethylene glycol diacrylate, 1,4-cyclohexanediol diacrylate, trimethylol triacrylate, trimethylol propane triacrylate, pentaerythritol triacrylate, tetraethylene glycol diacrylate, dipentaerythritol triacrylate, dipentaerythritol tetraacrylate, sorbitol triacrylate, sorbitol tetraacrylate, vinyl acetate, triallyl cyanurate, and the like. When the binder resin is UV-cured, the bank may further contain a photo-initiator. The photo-initiator is a material that generates radicals using light to trigger polymerization. The photo-initiator may include one or more selected from acetophenone-based compounds, biimidazole-based compounds, triazine-based compounds, and oxime-based compounds. Preferably, an oxime based compound may be used as the photo-initiator. Further, when the binder resin is thermally cured, polyester-based, polyurethane-based, and epoxy-based resins may be used as the binder resin.

The solvent may include ethyl acetate, n-butyl acetate, isobutyl acetate, ethylene glycol monomethyl ether acetate, ethylene glycol n-butyl ether acetate, diethylene glycol dimethyl ether, diethylene glycol monoethyl ether, dipropylene glycol monomethyl ether acetate, diethylene glycol methyl ethyl ether, diethylene glycol ethyl ether acetate, dipropylene glycol n-butyl ether, tripropylene glycol n-propyl ether, tripropylene glycol methyl ether, propylene glycol methyl ether acetate, propylene glycol diacetate, propylene glycol monomethyl ether, propylene glycol monoethyl ether acetate, cyclohexanone, 3-methoxy ethyl propionate, 3-ethoxy methyl propionate, 3-ethoxy ethyl propionate, and the like.

The dispersant is to prevent the pigment component from being eluted. A surfactant may be used as the dispersant. The dispersant may include, for example, a silicone-based, fluorine-based, ester-based, cationic, anionic, nonionic, or amphoteric surfactant. A filler, a curing agent, an antioxidant, an ultraviolet absorber, and the like may be further added to the bank as needed.

In this embodiment, instead of increasing the transmittance of the bank 190 to a range of 40% to 60%, in other words, instead of lowering the optical density representing the blockage percentage of the light, the blue color filter CF_B or the dummy blue color filter CF_B' protruding upwardly beyond a top face of the planarization layer 160 may be inserted into a lower portion of the bank 190, thereby compensating for the increase in the transmittance of the bank 190. In this way, a stack structure is formed in which the blue color filter CF_B or the dummy blue color filter CF_B' is inserted into a lower portion of the bank 190 such that the bank 190 completely encloses the blue color filter CF_B or the dummy blue color filter CF_B' protruding upwardly beyond a top face of the planarization layer 160. The transmittance of this stack structure may be lowered. Therefore, this stack structure may perform a function similar to that of a black bank.

Figure 5:
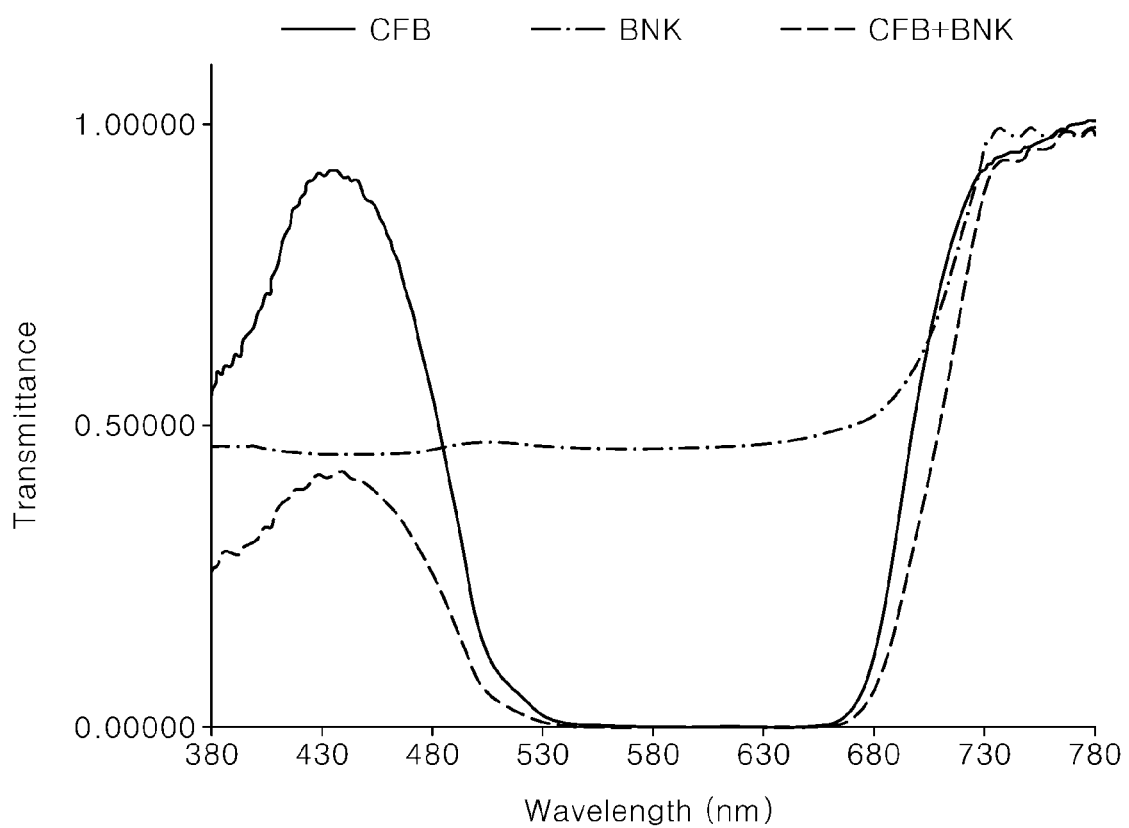
FIG. 5 and FIG. 6 are graphs showing transmittances of a blue color filter, a bank and a stack structure thereof according to one embodiment of the present disclosure.

FIG. 5 shows the transmittance of a stacked structure of a bank and a blue color filter according to one embodiment of the present disclosure. FIG. 5 further shows the transmittance of only the blue color filter and the transmittance of only the bank.

Referring to FIG. 5, the transmittance of the bank BNK according to one embodiment of the present disclosure is about 48% in the wavelength range of 380 nm to 650 nm. Depending on the content of the black pigment, the transmittance of the bank may be properly adjusted within the range of 40% to 60%. The blue color filter CFB has a transmissive peak in the wavelength range of 430 nm to 450 nm, and hardly transmits light therethrough in the wavelength range of 530 nm to 650 nm. In a structure CFB+BNK in which the bank and the blue color filter are stacked, a magnitude of the transmissive peak in the wavelength range of 430 nm to 450 nm decreases to 45% or smaller and hardly transmits light therethrough in the wavelength range of 530 nm to 650 nm.

In this embodiment, blue light in the white light emitted from one sub-pixel area partially passes through the structure CFB+BNK in which the bank and the blue color filter are stacked and proceeds to adjacent sub-pixel areas. However, such blue light may be absorbed by a red color filter or a green color filter. Therefore, according to this embodiment, an organic light-emitting display device with excellent color gamut and color reproduction range may be implemented.

When a conventional organic light-emitting display device is exposed to external light or UV for a long time, negatively charged gaseous compound produced by out-gassing of the bank adjacent to the organic light-emitting element moves through the bank and thus reacts with a plurality of organic material layers constituting the organic light-emitting element adjacent to the bank, such that the hole injection performance into the organic light-emitting layer is lowered, and an increase in the driving voltage of the organic light-emitting element, a decrease in luminance, and a decrease in lifespan thereof occur. Further, when the bank 190 is made of a material including the black pigment, a possibility in which an unreacted material remains is high due to the composition of the bank 190. Further, there are many types of compositions contained in bank 190. Thus, in contrast to a transparent bank, a relatively larger amount of the out-gassing may occur.

In this embodiment, as described above, the black pigment content of the bank 190 may be reduced such that the transmittance of the bank 190 is adjusted to about 40% to 60%, such that the out-gassing from the bank may be reduced. Accordingly, according to the present embodiment, problems such as an increase in the driving voltage of the organic light-emitting element, the decrease in luminance, and the decrease in lifespan thereof due to the out-gassing may be prevented.

In one embodiment, the bank 190 does not contain a black pigment, and may contain a red pigment and a green pigment.

Figure 6:
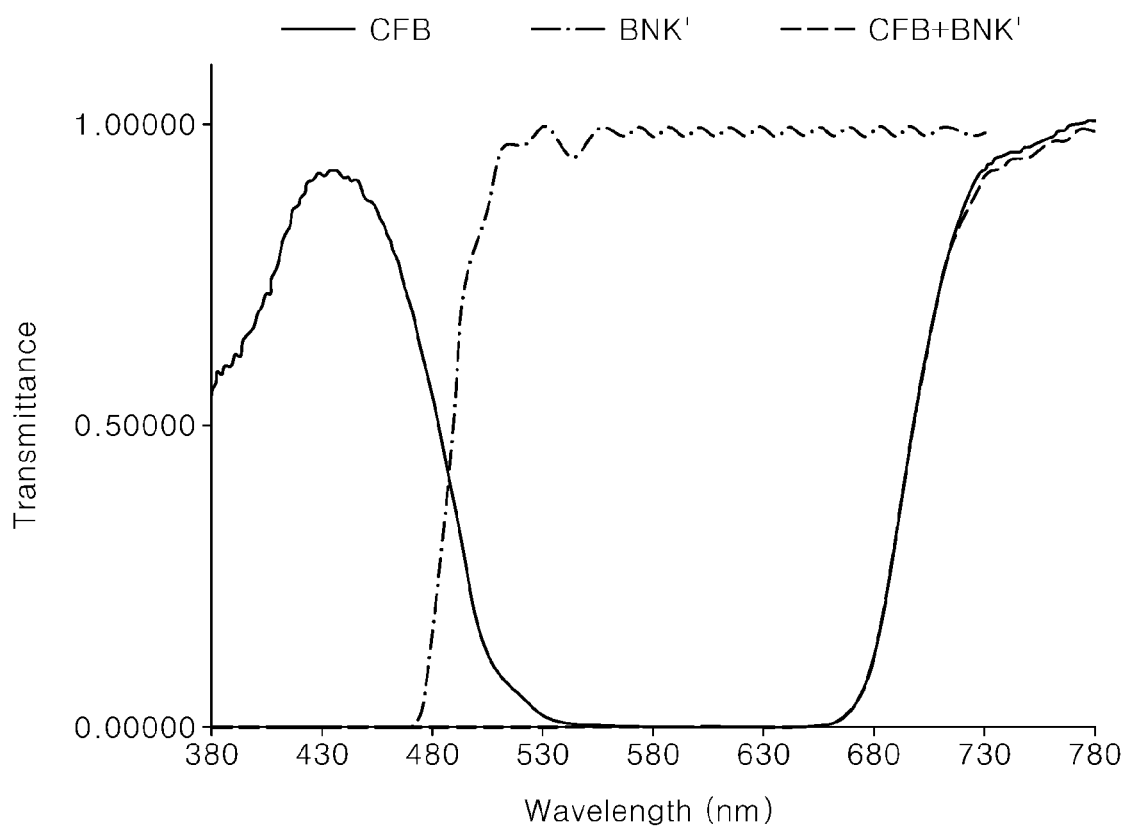

Referring to FIG. 6, a bank BNK' containing the red pigment and the green pigment hardly transmits therethrough light in a blue region in the wavelength range of 380 nm to 480 nm, or the bank BNK' may block blue light having a wavelength below 480 nm. The blue color filter CFB has a transmissive peak in the wavelength range of 430 nm to 450 nm, and hardly transmits therethrough light in the wavelength range of 530 nm to 650 nm. A structure CFB+BNK' in which the bank and the blue color filter are stacked hardly transmits therethrough light in the wavelength range of 380 nm to 670 nm.

Therefore, according to the present embodiment, an organic light-emitting display device having excellent color gamut and color reproduction range may be realized. Further, according to this embodiment, since the bank 190 has the lower content of the pigment compared to that in the conventional black bank (has a transmittance of 5% or smaller in the 380 nm to 650 nm wavelength band, and has the optical density of about 1.3), the problems such as the increase in the driving voltage of the organic light-emitting element, the decrease in the luminance, and lifespan thereof due to the out-gassing may be prevented.

In one embodiment, the bank 190 may contain the black pigment and a pigment capable of absorbing blue light. The black pigment may be contained in 15% to 18% by weight relative to the weight of the binder resin constituting the bank 190. The pigment capable of absorbing blue light may be contained in a 50% by weight relative to the weight of the black pigment.

According to this embodiment, an organic light-emitting display device excellent in color gamut and color reproduction range may be realized. The problems such as the increase in the driving voltage of the organic light-emitting element, the decrease in the luminance, and lifespan thereof due to the out-gassing may be prevented.

Figure 3:
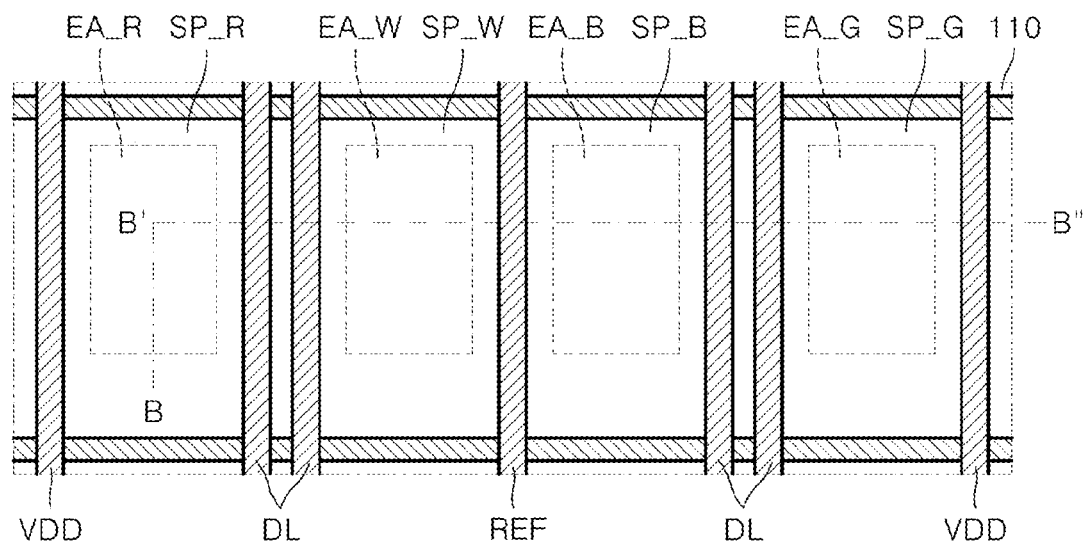
FIG. 3 is an enlarged view of one pixel area of an organic light-emitting display device according to one embodiment of the present disclosure, and shows schematically a plane of a pixel area of a four-color (R, W, G, B) organic light-emitting display device.

FIG. 3 is an enlarged view of one pixel area of an organic light-emitting display device according to one embodiment of the present disclosure, and schematically shows a plane of the pixel area of a four-color (R, W, G, B) organic light-emitting display device.

Referring to FIG. 3, signal lines including a gate line GL, a data line DL, a reference line REF and a driving voltage line VDD are disposed on a top face of the substrate 110. The gate line GL and the data line DL, the reference line REF and the driving voltage line VDD are cross each other.

According to the present embodiment, on the substrate 110, a red sub-pixel area SP_R, a white sub-pixel area SP_W, a blue sub-pixel area SP_B, and a green sub-pixel area SP_G may be defined by the aforementioned signal lines.

For example, each of the red sub-pixel area SP_R and the green sub-pixel area SP_G may be defined by two gate lines GL extending in parallel with each other and the driving voltage line VDD and the data line DL crossing the gate lines GL. Further, each of the white sub-pixel area SP_W and the blue sub-pixel area SP_B may be defined by two gate lines GL extending in parallel with each other and a data line DL and a reference line REF intersecting the two gate lines. An arrangement order of the pixel areas and a type and the number of signal lines extending between the adjacent pixel areas may vary as necessary.

The red sub-pixel area SP_R, the white sub-pixel area SP_W, the blue sub-pixel area SP_B, and the green sub-pixel area SP_G defined on the substrate 110 include a red light-emitting area EA_R, a white light-emitting area EA_W, a blue light-emitting area EA_B and a green light-emitting area EA_G, respectively.

Figure 4:
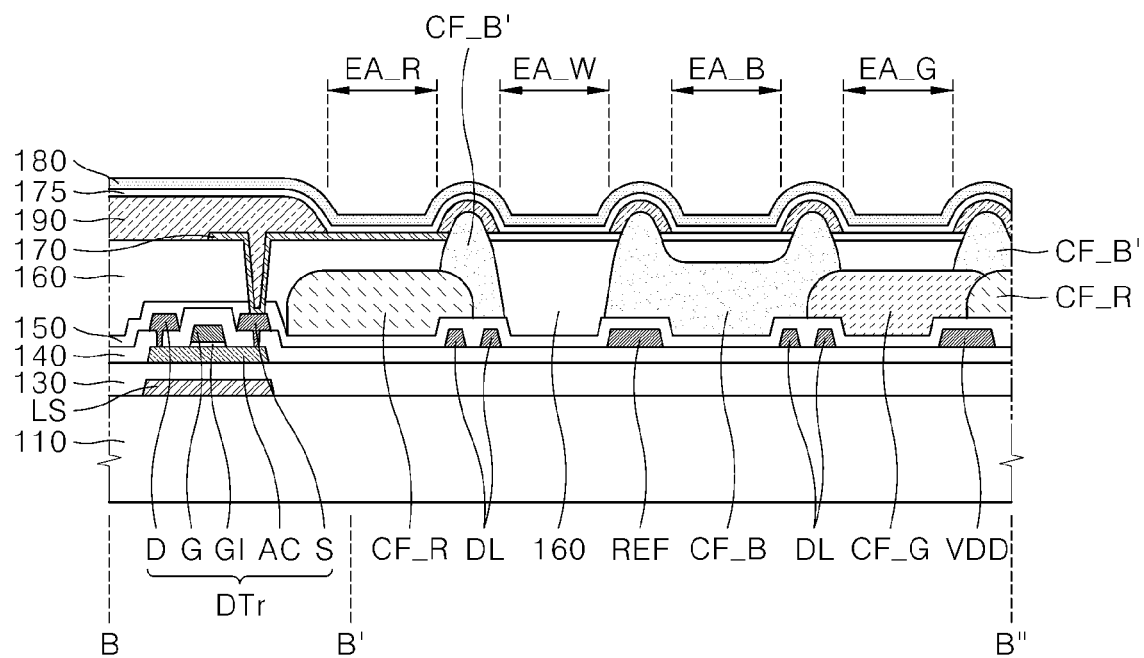
FIG. 4 shows a cross-section of the organic light-emitting display device cut along a B-B'-B" cutting line in FIG. 3.

In this connection, the red light-emitting area EA_R, the white light-emitting area EA_W, the blue light-emitting area EA_B, and the green light-emitting area EA_G may be defined as areas not to be covered with the bank (190 in FIG. 4). That is, a remaining area except for the red light-emitting area EA_R, the white light-emitting area EA_W, the blue light-emitting area EA_B, and the green light-emitting area EA_G may be covered with the bank 190.

FIG. 4 shows a cross-section of the organic light-emitting display device cut along a B-B'-B" cutting line in FIG. 3.

In particular, the cross section cut along the B-B' cutting line represents a cross section of a circuit area equipped with a driving thin-film transistor DTr of an organic light-emitting display device according to one embodiment of the present disclosure. Further, the cross section cut according to the B'-B" cutting line represents a cross section of a light-emitting area of the organic light-emitting display device according to one embodiment of the present disclosure. Hereinafter, contents described based on FIG. 1 and FIG. 2 are omitted.

Referring to FIG. 4, a light-blocking layer LS, a buffer layer 130, a driving thin-film transistor DTr, an interlayer insulating film 140, a passivation layer 150, a planarization layer 160, a bank 190, color filters CF_R, CF_B, and CF_G, a dummy blue color filter CF_B', a first electrode 170, an organic light-emitting layer 175, and a second electrode 180 may be provided on the substrate 110.

The buffer layer 130 and the interlayer insulating film 140 are disposed on the substrate 110. Signal lines defining each sub-pixel area are located on the interlayer insulating film 140. For example, data lines DL may be respectively located between the red light-emitting area EA_R and the white light-emitting area EA_W, and between the blue light-emitting area EA_B and the green light-emitting area EA_G. A driving voltage line VDD may be located between the green light-emitting area EA_G and the adjacent red light-emitting area EA_R.

The red color filter CF_R is located in the red light-emitting area EA_R, the blue color filter CF_B is located in the blue light-emitting area EA_B, and the green color filter CF_G is located in the green light-emitting area EA_G. The color filter is not located in the white light-emitting area EA_W. In the white light-emitting area EA_W, the white light emitted from the organic light-emitting layer 175 is emitted to an outside through the substrate 110 as is. The color filters CF_R, CF_B, and CF_G are disposed on the passivation layer 150 covering the data line DL, the reference line REF and the driving voltage line VDD.

On the passivation layer 150, the planarization layer 160 covering at least a portion of each of the color filters CF_R, CF_B, and CF_G is disposed.

A portion of the blue color filter CF_B between two adjacent sub-pixel areas (or two adjacent light-emitting areas) may protrude upwardly beyond a top face of the planarization layer 160. For example, a portion of the blue color filter CF_B between the white sub-pixel area SP_W and the blue sub-pixel area SP_B, for example, on the reference line REF may protrude upwardly beyond a top face of the planarization layer 160. A portion of the blue color filter CF_B between the blue sub-pixel area SP_B and the green sub-pixel area SP_G, for example, on the data lines DL, may protrude upwardly beyond a top face of the planarization layer 160 while covering an end of the green color filter CF_G. The portion of the blue color filter CF_B protruding upwardly beyond a top face of the planarization layer 160 may be completely covered with the bank 190.

The dummy blue color filter CF_B' may be additionally disposed between the red sub-pixel area SP_R and the white sub-pixel area SP_W, for example, on the data lines DL. The additionally disposed dummy blue color filter CF_B' may protrude upwardly beyond a top face of the planarization layer 160 while covering an end of the red color filter CF_R. The dummy blue color filter CF_B' protruding upwardly beyond a top face of the planarization layer 160 and disposed between the red sub-pixel area SP_R and the white sub-pixel area SP_W may be completely covered with the bank 190.

The sub-pixel areas are arranged periodically and repeatedly to form a matrix. Thus, a dummy blue color filter CF_B' may be additionally disposed between the green sub-pixel area SP_G and the red sub-pixel area SP_R. The dummy blue color filter CF_B' may be disposed between the green sub-pixel area SP_G and the red sub-pixel area SP_R, for example, on the driving voltage line VDD and protrude upwardly beyond a top face of the planarization layer 160 while simultaneously covering an end of the green color filter CF_G and an end of the red color filter CF_R. The dummy blue color filter CF_B' disposed between the green sub-pixel area SP_G and the red sub-pixel area SP_R and protruding upwardly beyond a top face of the planarization layer 160 may be entirely covered with the bank 190.

In other words, portions of the blue color filter CF_B respectively between the white sub-pixel area SP_W and the blue sub-pixel area SP_B, and between the blue sub-pixel area SP_B and the green sub-pixel area SP_G and protruding upwardly beyond a top face of the planarization layer 160 may be inserted into the bank 190. A portion of each of the dummy blue color filters CF_B' respectively disposed between the red sub-pixel area SP_R and the white sub-pixel area SP_W, and between the green sub-pixel area SP_G and the red sub-pixel area SP_R and protruding upwardly beyond a top face of the planarization layer 160 may be inserted into the bank 190.

In one embodiment, the bank 190 may be made of a resin containing a black pigment. The bank 190 may be made of a composition containing a black pigment, a binder resin, a solvent and a dispersant. For example, carbon black may be used as the black pigment. The black pigment may be contained in 15% to 18% by weight relative to the weight of the binder resin constituting the bank 190. A transmittance of the bank 190 may range from 40% to 60% in the wavelength range of 380 nm to 650 nm (an optical density thereof is about 0.65). This content of the black pigment is reduced to about ½ of a content of a black pigment constituting a conventional black bank (the transmittance thereof is lower than or equal to 5% in the wavelength range of 380 nm to 650 nm and the optical density thereof is 1.3).

In this embodiment, instead of increasing the transmittance of the bank 190 to a range of 40% to 60%, in other words, instead of lowering the optical density representing the blockage percentage of the light, the blue color filter CF_B or the dummy blue color filter CF_B' protruding upwardly beyond a top face of the planarization layer 160 may be inserted into a lower portion of the bank 190, thereby compensating for the increase in the transmittance of the bank 190. In this way, a stack structure is formed in which the blue color filter CF_B or the dummy blue color filter CF_B' is inserted into a lower portion of the bank 190 such that the bank 190 completely encloses the blue color filter CF_B or the dummy blue color filter CF_B' protruding upwardly beyond a top face of the planarization layer 160. The transmittance of this stack structure may be lowered. Therefore, this stack structure may perform a function similar to that of a black bank.

In this embodiment, as described above, the black pigment content of the bank 190 may be reduced such that the transmittance of the bank 190 is adjusted to about 40% to 60%, such that the out-gassing from the bank may be reduced. Accordingly, according to the present embodiment, problems such as an increase in the driving voltage of the organic light-emitting element, the decrease in luminance, and the decrease in lifespan thereof due to the out-gassing may be prevented.

In one embodiment, the bank 190 does not contain a black pigment, and may contain a red pigment and a green pigment. According to this embodiment, since a total content of the pigments may be reduced compared to a content of the black pigment contained in the conventional black bank, an organic light-emitting display device having excellent color gamut and color reproduction range may be realized. Further, problems such as an increase in the driving voltage of the organic light-emitting element, the decrease in luminance, and the decrease in lifespan thereof due to the out-gassing may be prevented.

In one embodiment, the bank 190 may contain the black pigment and a pigment capable of absorbing blue light. According to this embodiment, since a total content of the pigments may be reduced compared to a content of the black pigment contained in the conventional black bank, an organic light-emitting display device having excellent color gamut and color reproduction range may be realized. Further, problems such as an increase in the driving voltage of the organic light-emitting element, the decrease in luminance, and the decrease in lifespan thereof due to the out-gassing may be prevented.

Figure 7:
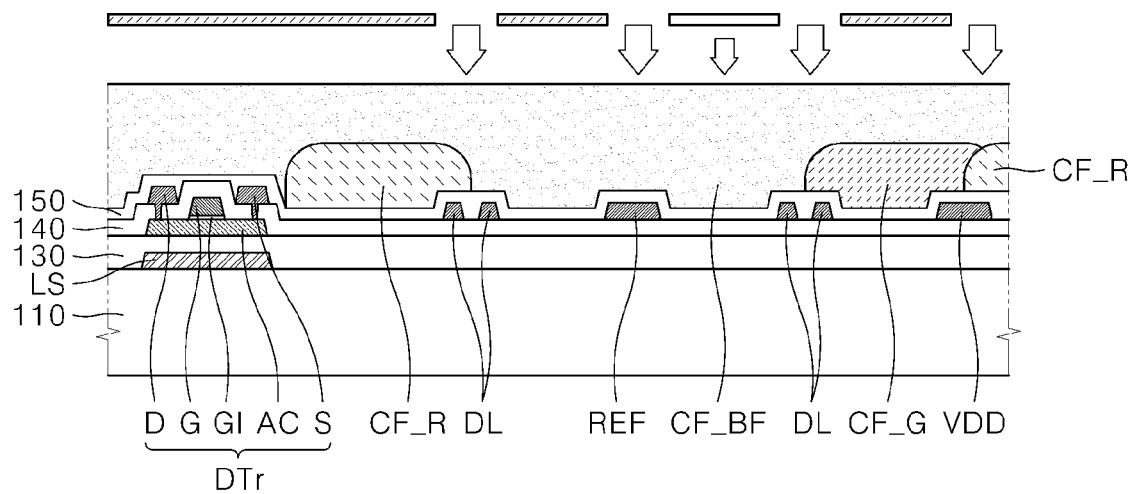
FIG. 7 and FIG. 8 are drawings for illustrating a method of forming a blue color filter according to one embodiment of the present disclosure.
Figure 8:
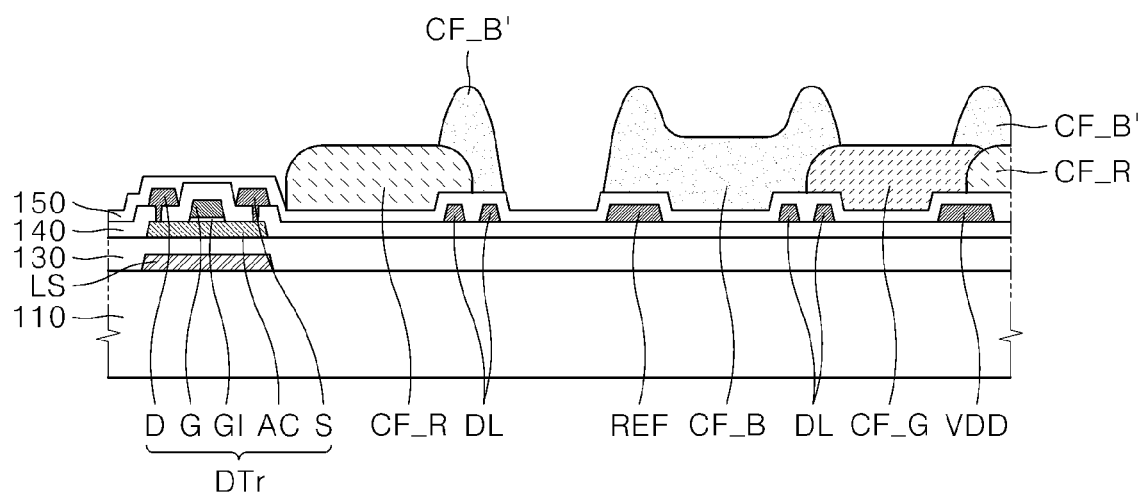

FIG. 7 and FIG. 8 are drawings for describing a method of forming a blue color filter according to one embodiment of the present disclosure.

Referring to FIG. 7 and FIG. 8, first, the light-blocking layer LS, the buffer layer 130, the driving thin-film transistor DTr, the interlayer insulating film 140, and the passivation layer 150 are vertically and sequentially formed on the substrate 110 in this order. Then, a red color filter composition is applied and dried on the passivation layer 150 to form a film, and then the red color filter CF_R is formed via exposure and development processes of the film. Then, a green color filter composition is applied and dried on the passivation layer 150 and the red color filter CF_R to form a film, and then the green color filter CF_G is formed via exposure and development processes of the film. At this time, the green color filter CF_G may cover one end of the red color filter CF_R.

Then, a blue color filter material is applied and dried on the passivation layer 150, the red color filter CF_R, and the green color filter CF_G to form a film CF_BF. After performing an exposure process on the film CF_BF using a half-tone type mask, a development process is performed thereon. The half-tone type mask includes a light-blocking pattern made of a material such as chromium to form a light-blocking area on a substrate made of quartz, and a semi-transmissive pattern made of a material such as a metal oxide, a metal-silicon, etc. and formed in a portion of a transmissive area to form a semi-transmissive area on the substrate made of quartz.

When the half-tone type mask is applied to the exposure process, a relatively thick pattern may be obtained in a portion corresponding to the transmissive area of the mask, while a relatively thin pattern may be obtained in a portion corresponding to the semi-transmissive area of the mask. The semi-transmissive area of the half-tone type mask used in this embodiment is formed only in an area corresponding to a blue light-emitting area.

Therefore, referring to FIG. 8, a thickness of an inner region (corresponding to the blue light-emitting area) of the blue color filter CF_B corresponding to the semi-transmissive area is smaller than a thickness of an outer region of the blue color filter CF_B (corresponding to an area between the blue light-emitting area and the green light-emitting area, and to an area between the blue light-emitting area and the white light-emitting area or corresponding to the signal lines). In other words, the outer region of the blue color filter CF_B may be formed to be more convex than the inner region of the blue color filter CF_B. Using the exposure and development process, the dummy blue color filter CF_B' is formed between the red light-emitting area and the white light-emitting area while covering an end of the red color filter CF_R. Further, the dummy blue color filter CF_B' is formed between the green light-emitting area and the red light-emitting area while simultaneously covering an end of the green color filter CF_G and an end of the red color filter CF_R Alternatively, due to the signal lines on the substrate 110, the passivation layer 150 has steps in areas corresponding to the signal lines. When increasing a viscosity of or decreasing a fluidity of the composition for the blue color filter, the blue color filter having a similar structure may be formed without using the half-tone type mask. In this case, a vertical dimension by which the blue color filter CF_B protrudes upwardly beyond the top face of the planarization layer 160 may be determined according to a vertical dimension of the step of the passivation layer 150.

Although the embodiments of the present disclosure have been described in more detail with reference to the accompanying drawings, the present disclosure is not necessarily limited to these embodiments. The present disclosure may be implemented in various modified manners within the scope not departing from the technical idea of the present disclosure. Accordingly, the embodiments disclosed in the present disclosure are not intended to limit the technical idea of the present disclosure, but to describe the present disclosure. The scope of the technical idea of the present disclosure is not limited by the embodiments. Therefore, it should be understood that the embodiments as described above are illustrative and non-limiting in all respects. The scope of protection of the present disclosure should be interpreted by the claims, and all technical ideas within the scope of the present disclosure should be interpreted as being included in the scope of the present disclosure.

What is claimed is:

1. An organic light-emissive display device comprising:
   a substrate including a first sub-pixel area, a second sub-pixel area, and a third sub-pixel area;
   a first color filter disposed in the first sub-pixel area;
   a second color filter disposed in the second sub-pixel area;
   a third color filter disposed in the third sub-pixel area;
   a planarization layer disposed on the first, second, and third color filters; and
   a bank layer disposed on the planarization layer and between adjacent ones of the first, second, and third sub-pixel areas,
   wherein a portion of the second color filter protrudes upwardly beyond a top face of the planarization layer, and
   wherein the bank layer covers the portion of the second color filter protruding upwardly beyond the top face of the planarization layer.

2. The device of claim 1, wherein opposite portions of the second color filter are disposed respectively between the first sub-pixel area and the second sub-pixel area and between the second sub-pixel area and the third sub-pixel area, and protrude upwardly beyond the top face of the planarization layer.

3. The device of claim 1, wherein a dummy second color filter is further disposed between the third sub-pixel area and the first sub-pixel area.

4. The device of claim 3, wherein the dummy second color filter protrudes upwardly beyond the top face of the planarization layer while covering both an end of the third color filter and an end of the first color filter.

5. The device of claim 1, wherein the first color filter is a red color filter, the second color filter is a blue color filter, and the third color filter is a green color filter.

6. The device of claim 1, wherein the bank layer contains a black pigment, wherein a transmittance of the bank layer is in a range of 40% to 60% in a 380 nm to 650 nm wavelength range.

7. The device of claim 1, wherein the bank layer blocks blue light having a wavelength below 480 nm.

8. An organic light-emissive display device comprising:
   a substrate including a first sub-pixel area, a second sub-pixel area, a third sub-pixel area, and a fourth sub-pixel area;
   a first color filter disposed in the first sub-pixel area;
   a second color filter disposed in the third sub-pixel area;
   a third color filter disposed in the fourth sub-pixel area;
   a planarization layer covering the first, second, and third color filters; and
   a bank layer disposed on the planarization layer and between adjacent ones of the first, second, third, and fourth sub-pixel areas, and
   wherein a portion of the second color filter protrudes upwardly beyond a top face of the planarization layer, and is inserted into the bank layer.

9. The device of claim 8, wherein opposite portions of the second color filter are disposed respectively between the second sub-pixel area and the third sub-pixel area and between the third sub-pixel area and the fourth sub-pixel area, and protrude upwardly beyond the top face of the planarization layer.

10. The device of claim 8, wherein a dummy second color filter is further disposed between the first sub-pixel area and the second sub-pixel area, and covers an end of the first color filter and protrudes upwardly beyond a top face of the planarization layer.

11. The device of claim 10, wherein an additional dummy second color filter is disposed between the fourth sub-pixel area and the first sub-pixel area, and covers both an end of the third color filter and an end of the first color filter and protrudes upwardly beyond a top face of the planarization layer.

12. The device of claim 8, wherein the first color filter is a red color filter, the second color filter is a blue color filter, and the third color filter is a green color filter.

13. The device of claim 8, wherein the bank layer contains a black pigment, wherein a transmittance of the bank layer is in a range of 40% to 60% in a 380 nm to 650 nm wavelength range.

14. The device of claim 1, wherein the bank layer blocks blue light having a wavelength below 480 nm.

15. An organic light-emissive display device comprising:
   a substrate including a plurality of sub-pixel areas;
   a plurality of color filters respectively disposed in the plurality of sub-pixel areas;
   a planarization layer covering the plurality of color filters; and
   a bank layer disposed on the planarization layer and between two adjacent ones of the sub-pixel areas,
   wherein a portion of the first color filter among the plurality of color filters protrudes upwardly beyond a top face of the planarization layer and is inserted into the bank layer.

16. The device of claim 15, wherein the portion of the first color filter protruding upwardly beyond the top face of the planarization layer covers an end of the second color filter among the plurality of color filters.

17. The device of claim 15, wherein a dummy color filter made of the same material as the first color filter covers an end of a third color filter among the plurality of color filters.

18. The device of claim 15, wherein a transmittance of the bank layer is in a range of 40% to 60% in a 380 nm to 650 nm wavelength range.

19. The device of claim 15, wherein the bank layer blocks blue light having a wavelength below 480 nm.

* * * * *